US012424722B2

(12) United States Patent
Valorge et al.

(10) Patent No.: US 12,424,722 B2
(45) Date of Patent: Sep. 23, 2025

(54) INTEGRATED WAVEGUIDE MICROCIRCUIT

(71) Applicant: COMMISSARIAT À L'ENERGIE ATOMIQUE ET AUX ENERGIES ALTERNATIVES, Paris (FR)

(72) Inventors: Olivier Valorge, Grenoble (FR); Didier Belot, Grenoble (FR); Hervé Boutry, Grenoble (FR); Jean-Baptiste Dore, Grenoble (FR); Christophe Dubarry, Grenoble (FR); Francesco Foglia Manzillo, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 233 days.

(21) Appl. No.: 17/954,788

(22) Filed: Sep. 28, 2022

(65) Prior Publication Data

US 2023/0103032 A1 Mar. 30, 2023

(30) Foreign Application Priority Data

Sep. 28, 2021 (FR) ...................................... 2110184

(51) Int. Cl.
| | |
|---|---|
| *H01P 1/16* | (2006.01) |
| *H01L 23/66* | (2006.01) |
| *H01P 1/208* | (2006.01) |
| *H01P 3/08* | (2006.01) |
| *H01P 3/12* | (2006.01) |
| *H01P 3/16* | (2006.01) |
| *H01P 5/107* | (2006.01) |

(52) U.S. Cl.
CPC .............. *H01P 5/107* (2013.01); *H01L 23/66* (2013.01); *H01P 1/2088* (2013.01); *H01P 3/081* (2013.01);
(Continued)

(58) Field of Classification Search
CPC .. H01P 3/121; H01P 3/122; H01P 3/16; H01P 1/2088; H01P 1/2002; H01P 1/20;
(Continued)

(56) References Cited

U.S. PATENT DOCUMENTS

| | | |
|---|---|---|
| 10,199,335 B2 | 2/2019 | Ishibashi |
| 2011/0018657 A1 | 1/2011 | Cheng et al. |

(Continued)

OTHER PUBLICATIONS

Search Report as issued in French Patent Application No. FR2110184, dated May 31, 2022.
(Continued)

*Primary Examiner* — Stephen E. Jones
(74) *Attorney, Agent, or Firm* — Pillsbury Winthrop Shaw Pittman LLP

(57) ABSTRACT

A microcircuit integrating a waveguide with a rectangular cross-section, the microcircuit including a first chip and a second chip assembled on each other, the waveguide being located in a junction zone between chips and extending in parallel to the chips, the waveguide including a first conductive plate located on the side of the first chip and parallel to the first chip, and a second conductive plate, located on the side of the second chip and parallel to the second chip, the waveguide being laterally delimited on one and the other side of the waveguide by one or more electrical connecting elements electrically connecting the first chip to the second chip.

15 Claims, 8 Drawing Sheets

(52) U.S. Cl.
CPC ............... *H01P 3/121* (2013.01); *H01P 3/16* (2013.01); *H01L 2223/6616* (2013.01); *H01L 2223/6627* (2013.01)

(58) Field of Classification Search
CPC .......... H01P 1/201; H01P 5/024; H01P 5/103; H01P 5/107; H01L 23/481; H01L 23/482; H01L 23/66; H01L 2223/6627; H01L 2223/6605; H01L 2223/6616; H01L 2223/6633; H01L 2223/58; H01L 2223/66
See application file for complete search history.

(56) References Cited

U.S. PATENT DOCUMENTS

| | | |
|---|---|---|
| 2015/0318597 A1 | 11/2015 | Park et al. |
| 2016/0336637 A1 | 11/2016 | Dang et al. |
| 2019/0319327 A1 | 10/2019 | Capet et al. |
| 2020/0303327 A1 | 9/2020 | Elsherbini et al. |
| 2020/0303328 A1 | 9/2020 | Braunisch et al. |
| 2021/0408654 A1* | 12/2021 | Correas-Serrano ..... H01P 5/087 |

OTHER PUBLICATIONS

Snyder, S., et al., "Thermally Enhanced 3 Dimensional Integrated Circuit (TE3DIC) Packaging," 2014 IEEE Electronic Components & Technology Conference, May 2014, XP032642250, pp. 601-608.

Seler, E., et al., "3D Rectangular Waveguide Integrated in embedded Wafer Level Ball Grid Array (eWLB) Package," 2014 Electronic Components & Technology Conference, (Year: 2014), pp. 956-962.

Bertrand, M., et al., "A 3-dB Coupler in Slow Wave Substrate Integrated Waveguide Technology," IEEE Microwave and Wireless Components Letters, vol. 29, No. 4, Apr. 2019, pp. 270-272.

Dey, U., et al., "Concept of a Dielectric Waveguide-Based Chip-to-Chip Multicast Interconnect," RFIT 2017, IEEE, (Year: 2017), pp. 156-158.

Acri, G., et al., "BenzoCycloButene-based in-Package Substrate Integrated Waveguides for sub-THz Applications," IEEE, 2020 50th European Microwave Conference (EuMC), 2021, pp. 41-44.

Vahabisani, N., et al., "Monolithic Wafer-Level Rectangular Waveguide and Its Transition to Coplanar Waveguide Line Using a Simplified 3-D Fabrication Process," IEEE Transactions on Components, Packaging and Manufacturing Technology, vol. 4, No. 1, Jan. 2014, pp. 168-176.

Parment, M., "Waveguides Embedded in the Substrate (SIW) multilayers with high performance for circuits low cost millimeters," Thesis publicly defended on Nov. 4, 2016.

Deslandes, D., et al., "Accurate modeling, wave mechanisms, and design considerations of a substrate integrated waveguide," IEEE Transactions on Microwave Theory and Techniques, vol. 54, No. 6, pp. 2516-2526, Jun. 2006.

Communication under Article 94(3) CBE as issued in European Patent Application No. 22197941.2, dated Aug. 8, 2024.

* cited by examiner

INTEGRATED WAVEGUIDE MICROCIRCUIT

CROSS-REFERENCE TO RELATED APPLICATIONS

This application claims priority to French Patent Application No. 2110184, filed Sep. 28, 2021, the entire content of which is incorporated herein by reference in its entirety.

FIELD

Generally speaking, the technical field is that of microelectronics, in particular that of microcircuits configured to emit, transmit or process electric signals at very high frequencies, typically above a hundred GHz.

BACKGROUND

Wireless communication systems operating at very high frequencies are currently undergoing strong development, especially in connection with the upcoming deployment of so-called "6G" communication systems (sixth generation of wireless communication technologies supporting cellular data networks, for succeeding 5G technology).

Within this context, it is desirable to improve performance of electronic devices, in particular microelectronic devices, operating in this frequency range (typically between 0.1 and 2 THz).

In such an electronic circuit, in order to transmit a high frequency signal from one point to another, it is known to employ a coplanar waveguide or "CPW", also called a "coplanar line". Such a waveguide is formed by two or three parallel metal tracks that extend over the surface of a same substrate. But with this type of waveguide, as with microstrip type lines, losses due to transmission through the guide are generally quite high (typically more than 3 or 4 dB per mm travelled at several tens of GHz). These losses are caused especially by radiation losses, as well as by the presence of a silicon substrate below and/or above the metal transmission lines (a substrate which can be conductive, especially at the interfaces, and thus induce losses).

For guiding high frequency signals, it is also known to employ a hollow metal waveguide, with a rectangular cross-section, made on the upper face of a substrate, the cross-section of the guide having a width of one or a few millimetres, or a fraction of one millimetre. Such a guide is described, for example, in the paper "Monolithic Wafer-Level Rectangular Waveguide and Its Transition to Coplanar Waveguide Line Using a Simplified 3-D Fabrication Process", by N. Vahabisani and M. Daneshmand, IEEE Transactions on Components, Packaging and Manufacturing Technology, vol. 4, no. 1, pp. 168-176, January 2014. Transmission losses with the waveguide described in this paper are in the order of 1 dB (at about 70 GHz) for a propagation length of 2.6 mm. They are thus lower than with a coplanar waveguide. However, such a waveguide increases the overall size of the microcircuit and its manufacture remains relatively complex.

SUMMARY

Within this context, a microcircuit incorporating a waveguide with a rectangular cross-section is provided, comprising a first chip and a second chip assembled on each other, the waveguide being located in a junction zone between chips and extending in parallel to the chips. The waveguide comprises a first conductive plate (possibly perforated), located on the side of the first chip and parallel to the first chip, as well as a second conductive plate (possibly perforated), located on the side of the second chip and parallel to the second chip, the waveguide being laterally delimited, on one side and on the other side of the guide, by one or more electrical connecting elements, electrically connecting the first chip to the second chip.

In the field of microelectronics, it is common practice to assemble several chips on each other to obtain a microcircuit having the structure of a three-dimensional stack. This makes it possible, for example, to conveniently offset electrical connections, using an interposer comprising an interconnection structure. It also allows for the combination of quite different functions performed on chips of different natures (for example made from different semiconductors). In any case, this type of assembly is common and well understood in terms of manufacturing. The assembly of two chips on each other, with electrical connections between chips, can be carried out, for example, by means of metal micropillars, generally based on copper (a technique generally called "Copper Pillar bonding" or "Copper Pillar Bump") or by the so-called "Direct Hybrid Bonding" technique (which will be set forth briefly below).

Making such a waveguide in the junction zone between two chips makes it possible to make use of the space available in this zone and to add new electrical functionalities without additional overall size.

This junction zone also has a geometry that is conducive to the construction of such a guide: the respective faces of the two chips, facing each other, each form a support that is well adapted for the first and second plates in question (which vertically delimit the guide), while the side borders of the guide are formed by connecting elements between chips (such as micropillars, for example), the construction of which, without such a junction zone, is well understood.

In the present application, a chip is understood to be an overall planar structure (the overall shape of which is that of a small plate), based on one or more semiconductor materials (as well as other materials, in particular metal materials and/or electrically insulating oxides), and capable of integrating various active or passive components (transistor, diode, resistor, radiating or guiding structure). The chip in question may be formed by a complete (and functionalised) wafer, or by only a portion of such a wafer (i.e. by a die).

This type of solution is particularly interesting for guiding electromagnetic waves at very high frequencies (especially in the range from 0.1 to 2 THz, adapted to future "6G" telecommunication applications), because the corresponding wavelengths are then small (a few mm, to a few fractions of one mm), which makes it possible to produce a low-overall size guide adapted to a microcircuit.

The above-mentioned electrical connecting elements may, for example, be electrically conductive contact elements, such as micropillars or microbeads, each allowing electrical conduction from the first plate to the second plate. In other words, these connecting elements may each form a conductive bridge between the first plate and the second plate, allowing an electric current to flow, by conduction, from one plate to the other.

The electrical connecting elements may also be elements that connect the first plate to the second plate through a capacitive connection (without direct electrical contact). In this case, each connecting element comprises:

either a micropost, which extends from one of the two plates, in the direction of the other plate, to a small distance from this other plate (to obtain a capacitive effect between an end face of the micropost and this other plate), or a first and a second micropost which connect to the first plate and to the second plate respectively and which extend facing each other, but without electrical contact between these two microposts.

In the second case (with two microposts facing each other), the capacitive coupling can be optimised by adding a metal pad on the end face of each of the first and second microposts. These pads are, for example, printed on the dielectric substrate between the two rows of microposts and are dimensioned to minimise transmission losses of the guide.

Further to the characteristics set forth above, the device set forth above may have one or more of the following optional characteristics, considered individually or in any technically contemplatable combination:

the electrical connecting elements comprise microposts or micropillars or microbeads arranged in a line one after the other, along the considered side of the waveguide;

said microposts or micropillars or microbeads are distributed along the considered side of the waveguide with a linear occupancy rate of more than 50%;

the first plate is covered with a first electrically insulating layer through which first conductive vias pass, the second plate is covered with a second electrically insulating layer through which second conductive vias pass, the second layer is in contact (generally directly in contact) with the first layer and adheres to the first layer, the second vias being in contact with the first vias, either directly or through connection elements, each connecting element comprising one of the first vias, as well as the corresponding second via with which it is in contact;

at least some of said connecting elements are electrically conductive contacting elements, each allowing electrical conduction from the first plate to the second plate;

at least one of said connecting elements comprises an electrically conductive micropost which extends from the first plate towards the second plate, and which is spaced from the second plate, to connect the first plate to the second plate through a capacitive connection;

said connecting element, which connects the first plate to the second plate through a capacitive connection, comprises an additional electrically conductive micropost, which extends from the second plate towards the first plate, to an end face of the additional micropost, the end face of the additional micropost being facing and at a reduced distance from an end face of said micropost; alternatively, provision may be made for said micropost to extend from the first plate to an end face of the micropost facing and at a reduced distance from the second plate (rather than facing an additional micropost).

the waveguide is dimensioned to guide an electromagnetic wave with a frequency f greater than or equal to 100 GHz;

the internal space of the waveguide, located between the first and second plates and between said connecting elements, is occupied by a dielectric medium having a relative permittivity $\varepsilon_r$ at frequency f, and in which the waveguide has a cross-sectional area whose width, in a direction parallel to the chips, is greater than $\lambda/2$, where $\lambda = c/(f \cdot (\varepsilon_r)^{1/2})$, where c is the velocity of the electromagnetic waves in vacuum;

the internal space of the guide, located between the first and second plates and between said connecting elements, is occupied by a composite structure formed by several different dielectric materials;

at least one of the first and second chips incorporates one or more components of the transistor, diode or amplifier type, configured to generate, amplify or filter an electric signal having a frequency greater than or equal to 100 GHz;

one end of the guide is open and at least part of the guide, which opens out through this opening, is flared and widens towards said opening; in other words, at this flared part, each cross-section of the guide has a width which is all the greater the closer the section is to the outlet opening of the guide;

the guide has one or more abrupt cross-section changes (that is. with a section discontinuity, for example a width change, with skipping from a first width to a second different width);

the waveguide comprises one or more additional connecting elements, each located within the guide; these one or more additional connecting elements are distributed within the guide, for example in a specific distribution of a function (for example filtering) to be performed by the guide;

said additional connecting elements are distributed in one or more lines of additional connecting elements, each extending transversely to the guide, within the guide, to form a constriction in the guide;

the waveguide comprises one or more lines of inner microposts, each located within the guide, each inner micropost extending from the first plate towards the second plate and having a height less than a gap between the first plate and the second plate, for example less than two thirds of said gap; the one or more inner microposts are distributed within the guide, for example in a specific distribution of a function (for example filtering) to be performed by the guide;

in particular, the one or more inner microposts may be distributed in one or more lines of inner microposts, each extending transversely to the guide, within the guide.

The present technology and its various applications will be better understood upon reading the following description and examining the accompanying figures.

BRIEF DESCRIPTION OF THE FIGURES

The figures are set forth for illustrating and in no way limiting purposes.

DETAILED DESCRIPTION

Figure 1:
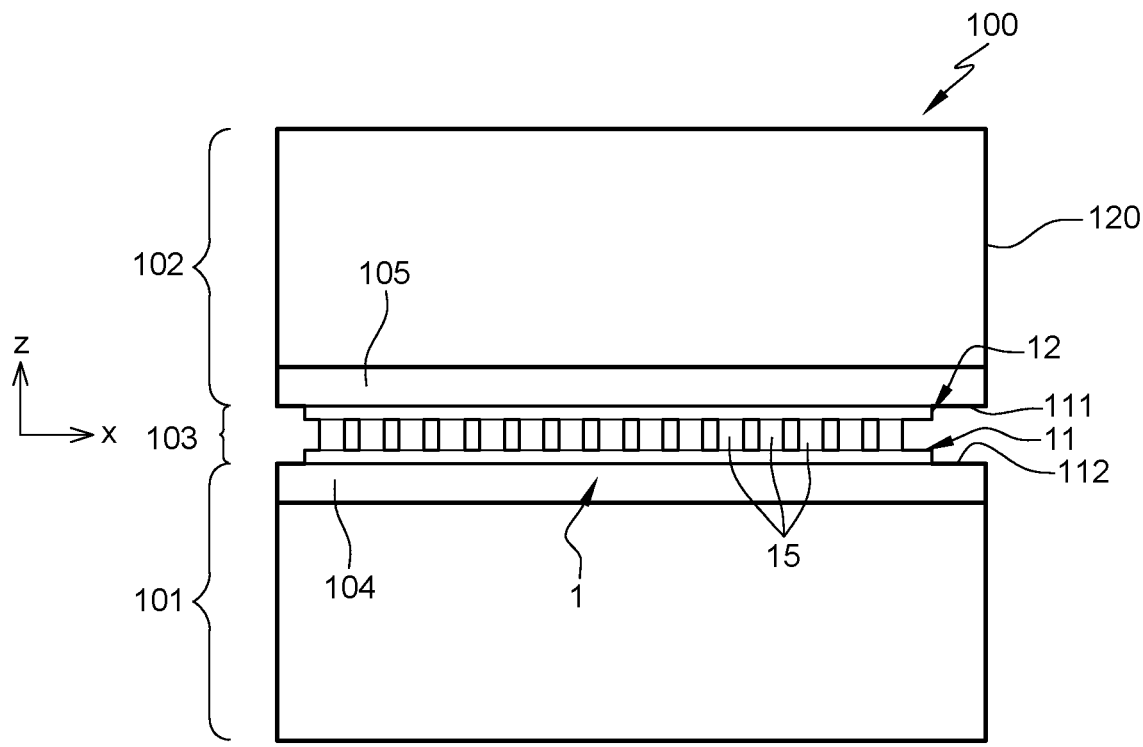
FIG. 1 schematically represents a microcircuit comprising two chips assembled on each other and comprising a waveguide located in an assembly zone, between these two chips, in a side view.
Figure 10:
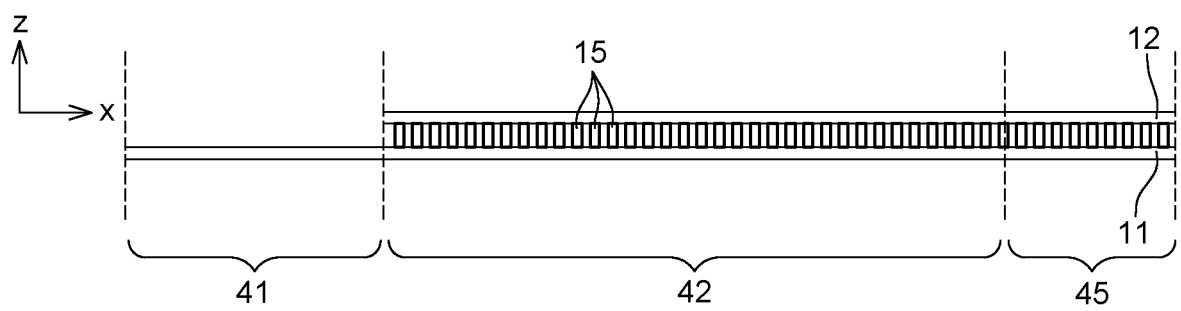
FIG. 10 schematically represents the waveguide of FIG. 9, in a side view.

As indicated above in the "summary" section, the present technology relates to a microcircuit incorporating a waveguide with a rectangular cross-section, this guide being made in a junction zone between a first chip (lower chip) and a second chip (upper chip) of the microcircuit (see FIGS. 1 and 10). The waveguide is laterally delimited by electrically conductive connecting elements (for example microbeads, micropillars or vias) electrically connecting the first chip to the second chip.

FIG. 1 schematically represents such a microcircuit 100, in which the first and second chips 101 and 102 are assembled by means of micropillars. For this embodiment, the connecting elements between chips, which laterally delimit the waveguide, 1, of this microcircuit 100, are micropillars 15.

Figure 2:
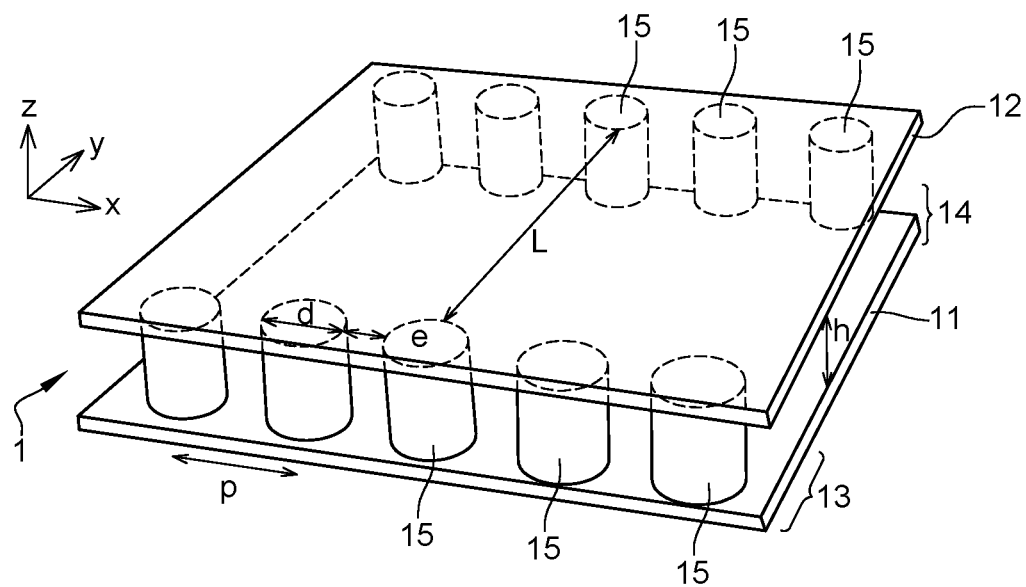
FIG. 2 schematically and partially represents the waveguide of FIG. 1, in a perspective view.
Figure 4:
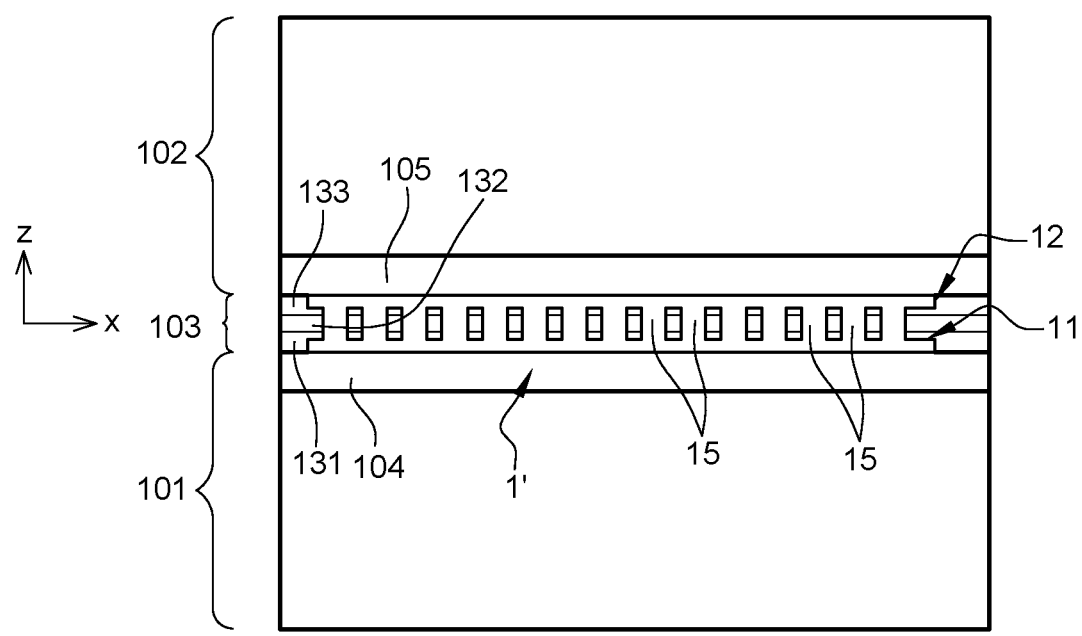
FIG. 4 schematically represents one alternative of the waveguide of FIG. 2, in a side view.

FIG. 2 schematically represents the waveguide 1 of this first embodiment, partially in a perspective view. FIG. 4 schematically represents one alternative to the first embodiment (in which the internal space of the waveguide is occupied by different dielectric materials, instead of a same homogeneous dielectric medium).

Figure 5:
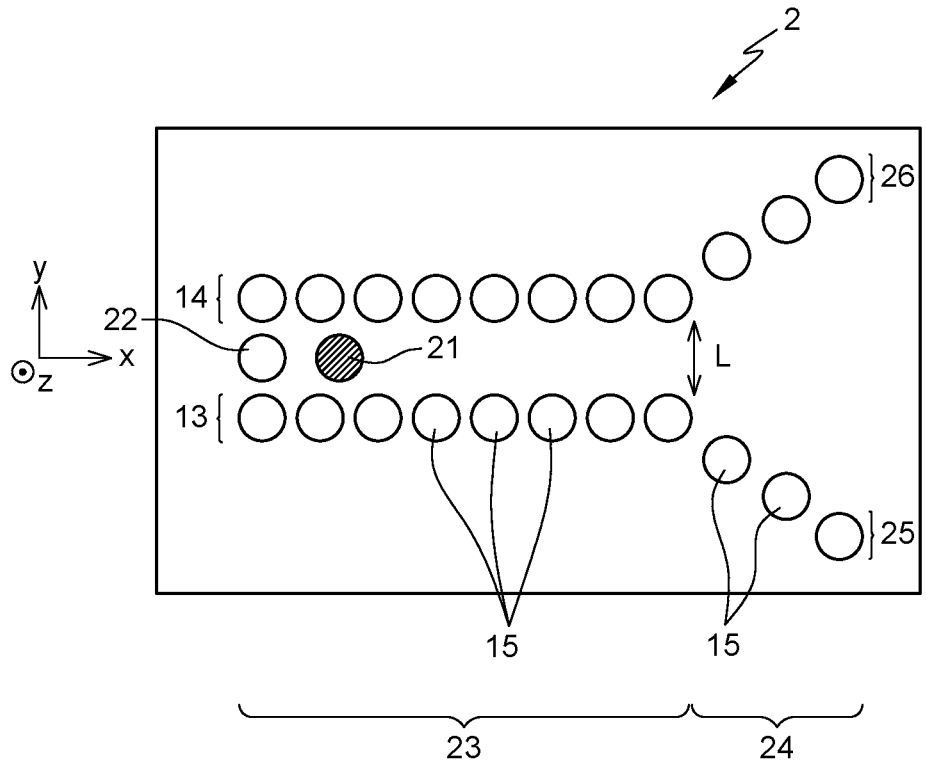
FIG. 5 schematically represents, in a top view, a second embodiment of a waveguide that can equip the microcircuit of FIG. 1, instead of or in addition to the waveguide of FIG. 2.
Figure 7:
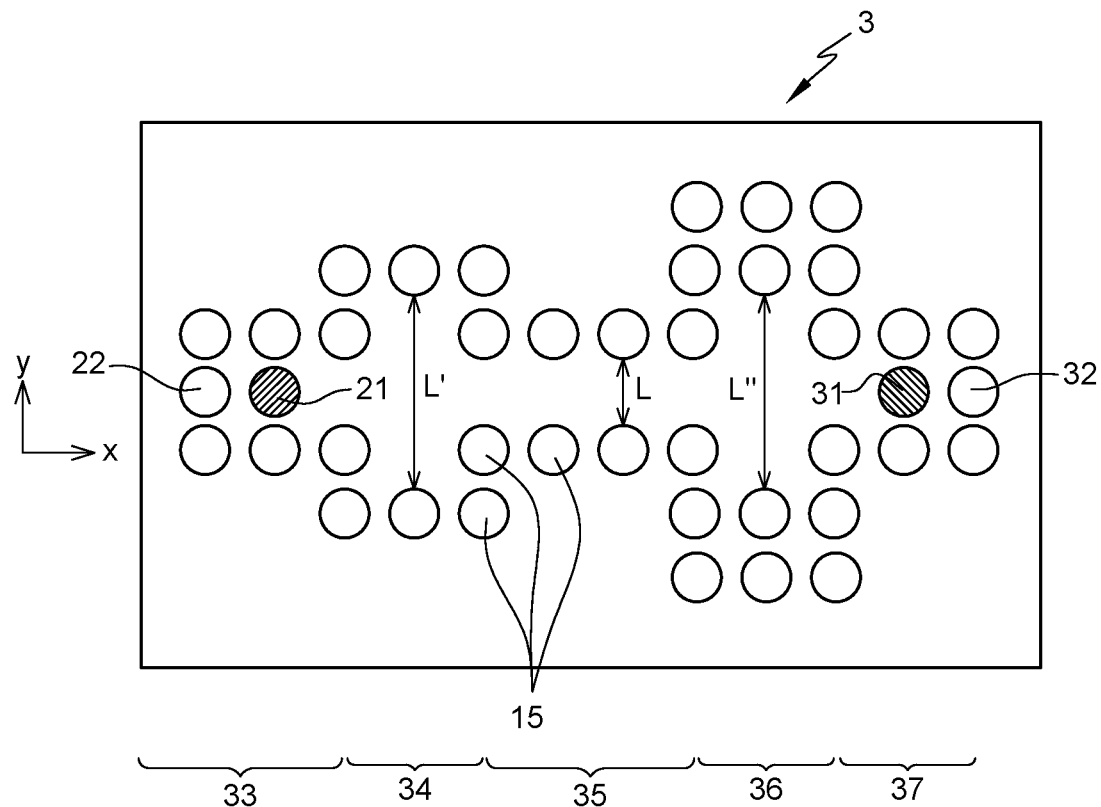
FIG. 7 schematically represents, in a top view, a third embodiment of a waveguide that may equip the microcircuit of FIG. 1, instead of or in addition to the waveguide of FIG. 2.
Figure 8:
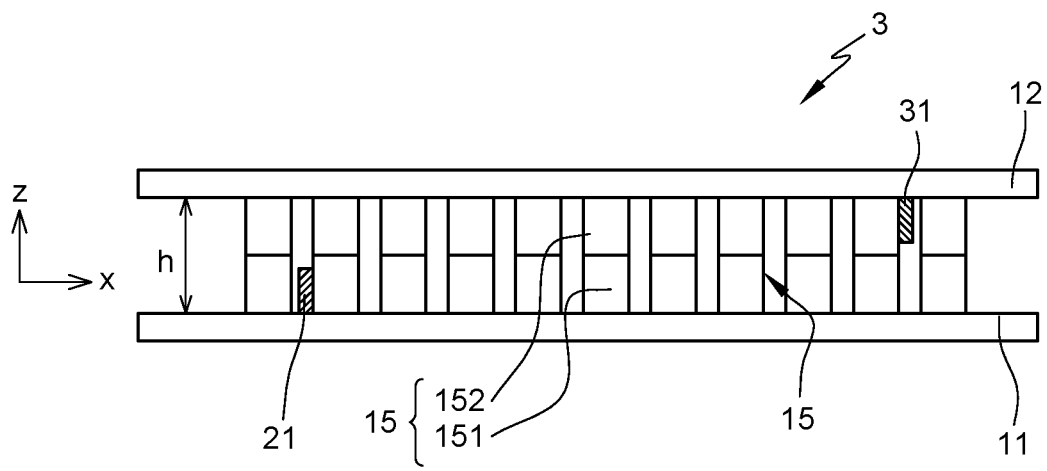
FIG. 8 schematically represents the waveguide of FIG. 7, in a side view.
Figure 9:
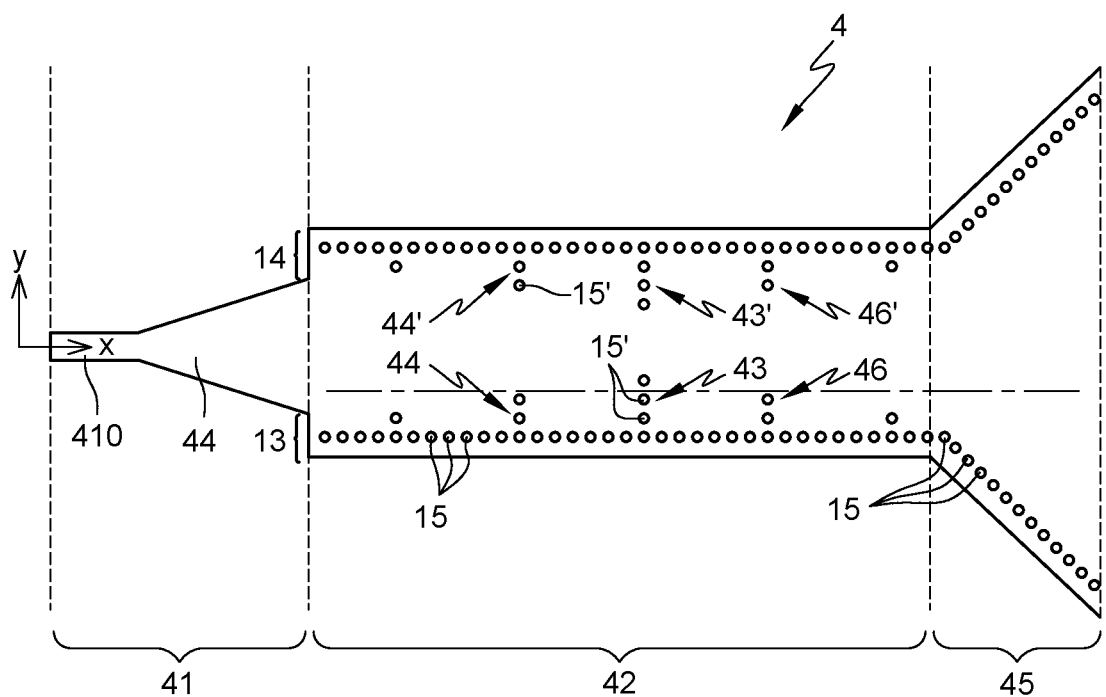
FIG. 9 schematically represents, in a top view, a fourth embodiment of a waveguide that may equip the microcircuit of FIG. 1, instead of or in addition to the waveguide of FIG. 2.
Figure 11:
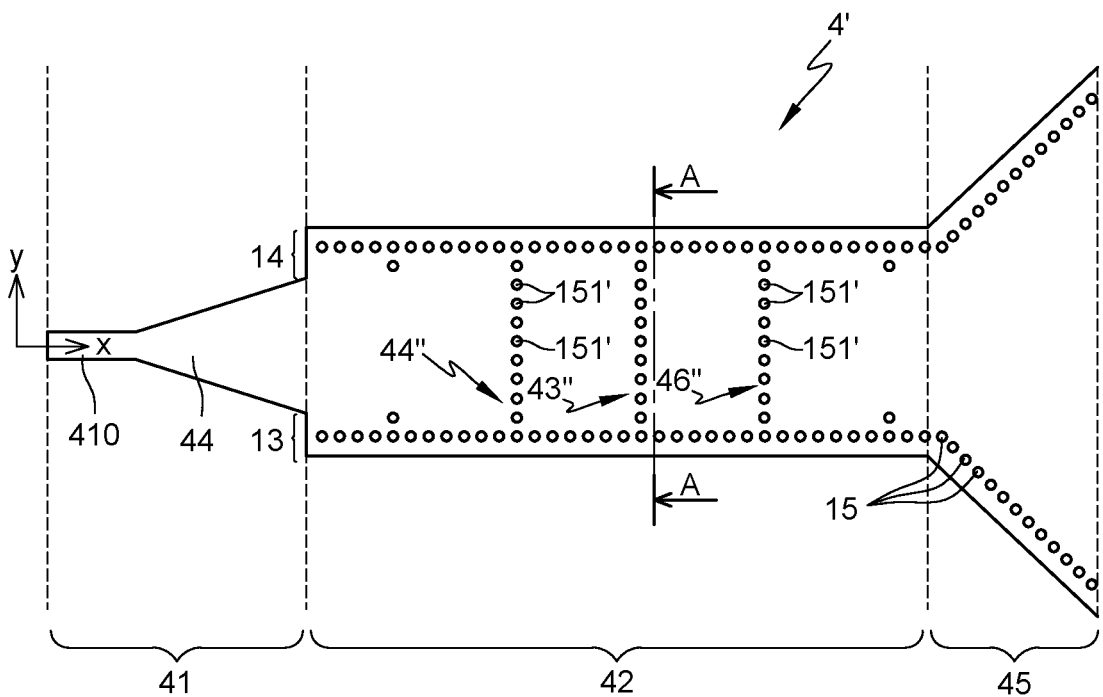
FIG. 11 schematically represents one alternative to the waveguide of FIG. 9, in a top view.

FIGS. 5, 7 and 9 in turn represent a second, third and fourth embodiment of a waveguide 2; 3; 4, which could equip the microcircuit 100 of FIG. 1, instead of or in addition to the waveguide 1. The waveguide 2; 3; 4 according to these second, third and fourth embodiments is also laterally delimited by micropillars 15. FIG. 11 schematically represents one alternative to the fourth embodiment.

Figure 13:
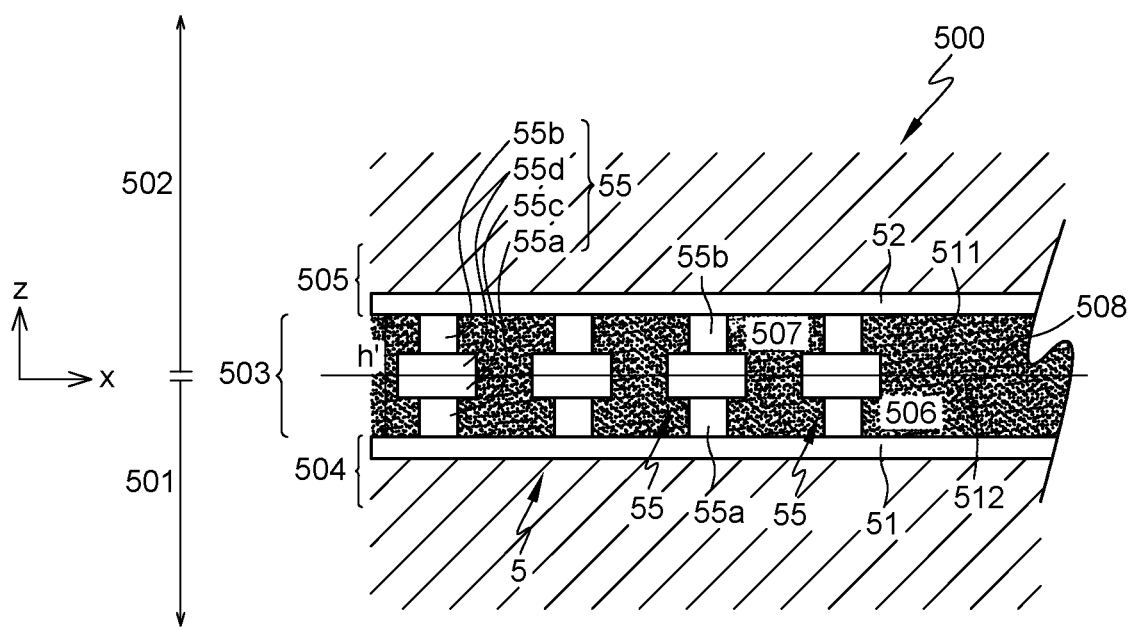
FIG. 13 schematically represents a microcircuit according to another embodiment, comprising two chips assembled on each other and comprising a waveguide located in an assembly zone, between these two chips, in a side view.

FIG. 13 in turn represents a fifth embodiment of a waveguide, 5, made in an inter-chip assembly zone. For this embodiment, the two chips are assembled by "Direct Hybrid Bonding" instead of being assembled by a micropillar technique. The connecting elements 55, which laterally delimit the guide 5, then comprise vias 55a, 55b, which pass through two insulating layers 506 and 507 brought into contact with each other, at an assembly surface 508, to bond the two chips 501 and 502 together.

Figure 14:
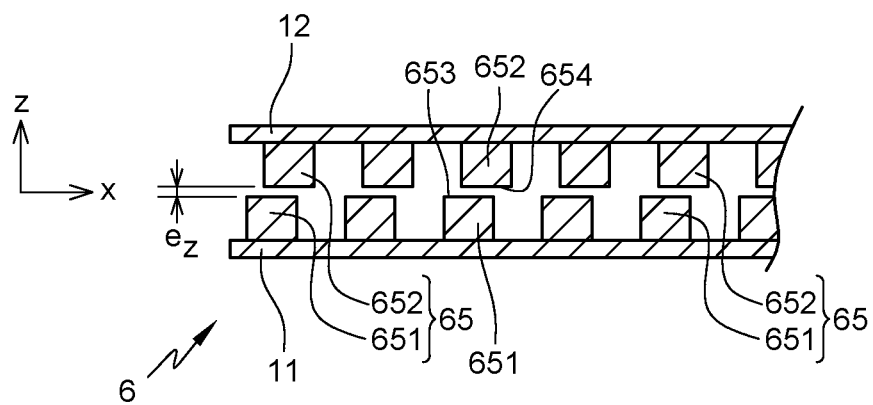
FIG. 14 schematically represents yet another exemplary embodiment of a waveguide, which may, for example, equip the microcircuit of FIG. 1, instead of or in addition to the waveguide of FIG. 2.

FIG. 14 schematically represents a sixth embodiment of a waveguide, 6, made in an inter-chip assembly zone. In this embodiment, the chips are assembled by means of micropillars (as in embodiments 1 to 4). On the other hand, the connecting elements which laterally delimit the guide are then each formed by two microposts (one connected to the first chip, and the other connected to the second chip) facing each other, but without electrical contact between them (the two microposts establishing a capacitive electrical connection between the chips instead of a "conductive" connection).

In the following, the two assembly techniques in question (by micropillars and by direct hybrid bonding) will be briefly set forth.

Aspects common to the six embodiments of the waveguide 1; 2; 3; 4; 5; 6 (and their alternatives 1' and 4') will then be set forth (width of the guide and occupancy rate of the connecting elements along the guide, for example).

Finally, these six embodiments of the guide (and their alternatives 1' and 4') will each be set forth in more detail.

From one embodiment to another, identical or corresponding elements will be marked as far as possible by the same reference numbers.

Microcircuit Chips

In any embodiment, the microcircuit 100; 500 comprises the first chip 101; 501, and the second chip 102; 502 mentioned above (see FIGS. 1 and 13).

Here, at least one of the two chips, and even both, is functionalised, in that it integrates components (including active components), especially of the transistor, diode or amplifier type (not represented). At least one of these components is configured to generate, transmit, amplify or filter an electric signal having a frequency f greater than or equal to 100 GHz, or even greater than or equal to 300 GHz.

Here, the first chip 101; 501 is based on silicon, and the second chip 102; 502 is based on Gallium Arsenide GaAs for example (more generally, based on a III-V-type semiconductor, that is comprising an element from column V of the periodic table of the elements, for example nitrogen N or phosphorus P, associated with one or more elements from column III of the periodic table of the elements, for example gallium Ga, aluminium Al and/or indium In). The first chip 101; 501, based on silicon, constitutes a well-adapted support for making one or more components allowing frequency rise of the signals, and allowing generation of a very high frequency signal, but of generally limited power. It may, for example, comprise various CMOS-type components, including a preamplifier (which delivers a signal at the frequency f mentioned above). As for the second chip 102; 502, it is a well-adapted support for making one or more components allowing power amplification at these very high frequencies.

It should be noted, however, that the first and second chips could, alternatively, be formed from semiconductor materials different from those mentioned above; in particular, they could both be formed from the same type of semiconductor material (for example silicon).

The first chip 101; 501 and the second chip 102; 502 are assembled on each other, parallel to each other, to form a three-dimensional stack. These two chips are assembled on each other in that they are mechanically connected to each other, with the second chip 102; 502 located above the first chip 101; 501, in parallel thereto, almost against the first chip 101; 501. In practice, the mechanical connection between chips is obtained by adhering surface elements 151; 55c of the first chip 101; 501, with surface elements 152; 55d of the second chip 102; 502. The first chip 101; 501 has a first surface 111; 511, the second chip 102; 502 has a second surface 112; 512, and the two chips are assembled in such a way that the first surface 111; 511 extends facing the second surface 112; 512, in parallel to and at a reduced distance from the second surface, or even directly in contact with this second surface (in the case of an assembly of the "Direct Hybrid Bonding" type, such as that of FIG. 13).

The two chips may be electrically connected to each other by electrical connections, not represented, (which pass through the assembly zone) not forming part of the guide.

Micropillar Assembly

In the case of assembly by a micropillar type technique, which is the case of the microcircuit 100 of FIG. 1, each micropillar 15 typically comprises two conductive microposts 151, 152 (see FIG. 6, for complement purposes), often referred to as "posts", one made on the first chip and the other on the second chip, connected to each other, for example by a micro-solder bead (formed from a tin or indium-based material). Each micropost 151, 152 thus forms a half-micropillar. Such a micropillar 15 has for example a total height of between 5 and 50 microns. The first surface 111 mentioned above is then a free surface that the first chip 101 has before assembly (it is for example its upper free surface), apart from micropillars and other assembly elements. Similarly, the second surface 112 is then a free surface that the second chip 102 has before assembly (for example its lower free surface), apart from micropillars and other assembly elements. The assembly zone 103, where the waveguide 1 is located, extends between this first surface 111 and this second surface 112 (and possibly slightly beyond, for example up to a metallisation layer of each chip), with a thickness typically below 100 microns.

During assembly, the second chip 102 is placed facing the first chip 101, with its microposts 152 opposite to the corresponding microposts 151 of the first chip 101, and the two chips are brought closer to each other to bring these microposts into contact with each other (this contact may be made by means of a micro-solder bead). An optional filler material (generally referred to as "underfill"), for example a polymer, may then be introduced into the assembly zone 103 to fill the unoccupied part of this zone (in order to obtain a more mechanically and thermally robust assembly, by forming a bonding layer between chips).

It should be noted that, in general, in the present application, the term "micropost" is used to designate an element, for example of cylindrical shape, projecting from the chip under consideration, extending in the direction of the other chip but not completely to the other chip. The dimensions (diameter, height) of such a micropost are typically greater than 10 microns, and less than 50 microns. And by "micropillar", or, equivalently, by "complete micropillar", it is meant an element that extends from one of the two chips to the other chip, connecting these two chips together. Such a micropillar is, for example, formed by two microposts, one made on the first chip and the other on the second chip, connected to each other by a micro-solder bead. The microposts and micropillars in question are electrically conductive. They are typically formed from one or more metal materials. Each micropost 151, 152 may be made as one piece, formed by a single metal material (for example copper or a copper-based alloy), or comprise multiple portions (multiple layers) formed by different metal materials.

In the case of waveguides 1; 1'; 2; 3; 4 and 4', the electrical connecting elements, which laterally delimit the guide, are each formed by one of these assembly elements, thus by a complete micropillar 15, which is entirely conductive (which brings the first chip in electrical contact with the second chip, via a "conductive" connection).

In the case of the waveguide 6 of FIG. 14, the first and second chips are assembled to each other by complete micropillars as described above ("assembly" micropillars which are not represented in FIG. 14). However, the electrical connecting elements 65, which laterally delimit the guide 6, are not these assembly elements themselves, in this case. In this embodiment, the connecting elements 65 each comprise two microposts 651, 652 facing each other, but without contact between these two microposts 651, 652 (a thin spacing being present between the respective end faces 653, 654 of these microposts 651, 652), these two microposts providing a capacitive connection between the chips.

The first chip 101 additionally comprises, on the side of the first surface 111, for example just below this surface, one or more metal levels 104 (metallisation planes), which may for example comprise interconnection tracks.

The waveguide 1; 1'; 2; 3; 4; 4'; 6 comprises a first conductive plate, 11, parallel to the chips, located on the side of the first chip 101 (this plate delimits the waveguide 1; 1'; 2; 3; 4; 4'; 6 at the lower part). This first plate 11 may be formed on, or slightly recessed from, the first surface 111. It may be formed in the metal level, or in one of the metal levels 104 mentioned above.

Similarly, the second chip 102 comprises, on the side of the second surface 112, for example just above this surface, one or more metal levels 105 (metallisation planes), which may for example comprise interconnecting tracks. The waveguide 1; 1'; 2; 3; 4; 4'; 6 comprises a second conductive plate, 12, parallel to the chips, located on the side of the second chip 102 (this plate here delimits the waveguide 1; 1'; 2; 3; 4; 4'; 6 at the upper part). This second plate 12 may be formed on, or slightly recessed from, the second surface 112. It may be formed in the metal level, or in one of the metal levels 105 in question.

"Direct Hybrid Bond" Assembly

In the case of a "Direct Hybrid Bonding" type assembly, which is the case of the microcircuit 500 of FIG. 13, each chip 501, 502 has, before assembly, a surface insulating layer 506, 507, for example made of silicon oxide $SiO_2$, through which conductive vias, 55a, 55b (generally metal, for example copper-based, vias and sometimes called "hybrid bonding via") pass. Optionally, each via 55a, 55b may connect to a conductive connection element 55c, 55d on the side of a free surface 511, 512 of this insulating layer 506, 507. This connection element 55c, 55d, which is for example in the form of a small metal plate, or "hybrid bonding metal"), has a larger cross-section than that of the via 55a, 55b itself (the element 55c is wider than the via 55a), in order to allow better electrical contact between chips. The via itself, or in this case the connection element 55c, 55d considered, is flush with the free surface 511, 512 of this insulating layer 506, 507. This free surface 511, 512 with the vias or connection elements 55c, 55d which are flush therewith is obtained by planarisation, for example of the chemical-mechanical polishing (CMP) type. This is the free surface of the chip considered, 501 or 502, before assembly. The first surface 511 mentioned above is formed by this free surface of the first chip 501, while the second surface 512 is formed by the free surface of the second chip 502. The two chips 501 and 502 are assembled by bringing the first surface 511 and the second surface 512 into contact with each other, after having laterally aligned the two chips with respect to each other so as to position the connection elements of the first chip, 55c, opposite to those, 55d, of the second chip (or, in the absence of such elements, so as to position the vias of the first chip facing those of the second chip). After assembly, the two surfaces 511 and 512 are one and the same, forming a single assembly surface 508.

The first chip 501 comprises a metal level 504 (metallisation layer often referred to as the layer "MZ"), located below the insulating layer 506, for example immediately below the insulating layer 506.

The waveguide 5 comprises a first conductive plate, 51, parallel to the chips, located on the side of the first chip 501 (this plate, which belongs to the first chip, delimits the waveguide 1; 2; 3; 4 at the lower part). This first plate 51 can be formed, as here, in the metal level 504. The vias 55a each extend through the insulating layer 506, and to this first plate 51 to which they connect.

Similarly, the second chip 502 comprises a metal level 505 (metallisation layer "MZ"), located above, for example immediately above, the insulating layer 507. And the waveguide 5 comprises a second conductive plate, 52, parallel to the chips, located on the side of the second chip 502 (this plate, which is part of the second chip, here delimits the waveguide 5 at the upper part). This second plate 52 may be formed, as here, in the metal level 505. The vias 55b each extend through the insulating layer 507, and to this second plate 52 to which they connect.

By "via", it is meant here a conductive, generally metal, element which passes through an insulating layer and allows mechanical and electrical connections of two metal elements on either side of this insulating layer. Such a via may have an overall cylindrical shape, or a flat wall shape perpendicular to the chips (especially when the via is obtained by filling a trench etched into the insulating layer in question). Such a via may be obtained by opening a trench or hole in the insulating layer, and then filling the trench or hole with a conductive material. Such vias may also be obtained by first forming these individual conductive elements on one face of the chip (by growth, or etching), and then covering them with an insulating layer (of $SiO_2$) which is then planarised.

Optionally, the vias in question may extend, in the corresponding chip, beyond the insulating layer 506, 507, for example through a silicon layer, or connect to other vias (of the "Through Silicon Via" type) passing through such a silicon layer.

In the case of such a "direct hybrid bond" assembly, the above-mentioned connecting elements 55 each comprise a via 55a and the corresponding via 55b (i.e. the one in contact with this via 55a). Alternatively, the connecting elements 55 may each comprise a plurality of vias 55a, in contact with a plurality of vias 55b. The contact in question may be a direct contact, or, as here, a contact via the aforementioned connection elements 55c and 55d, these connection elements then also forming part of the connecting element 55.

For this type of assembly, the assembly zone 503 is a zone that extends on either side of the assembly surface 508. It extends, for example, on one side, to the metallisation plane 504 of the first chip 501, and on the other, to the metallisation plane 505 of the second chip 502. This assembly zone 503 has a thickness of, for example, between 1 and 10 microns.

Properties Common to Waveguides

Whatever the embodiment, the waveguide 1; 1'; 2; 3; 4; 4'; 5; 6 extends parallel to the chips. Three mutually perpendicular axes, x, y and z, are introduced to facilitate description of the guide. The axis z is perpendicular to the chips. The axis x is a mean longitudinal axis of the guide. It is the axis along which the guide extends (this is the direction of propagation of the waves guided in the guide). The axis y is an axis transverse to the guide, and parallel to the chips.

The waveguide 1; 1'; 2; 3; 4; 4'; 5; 6 comprises the following electrically conductive elements, which allow electromagnetic waves to be guided inside the guide:

the first plate 11; 51 mentioned above (in the lower part of the guide), the second plate 12; 52 (in the upper part of the guide, and which is parallel to the first plate), and on either side of the guide, the connecting elements 15; 55; 65, which laterally delimit the guide 1; 1'; 2; 3; 4; 4'; 5; 6 and which connect the first and second plates to each other.

The guide is laterally delimited on one side, by a first line of connecting elements 15; 55; 65 arranged one after the other, and on the other side by a second line of connecting elements 15; 55; 65 also arranged one after the other (see FIGS. 2, 5 and 9 for example).

For the waveguide 1, the first and second lines of connecting elements, which bear references 13 and 14 respectively, are rectilinear and parallel to each other. This is also the case for portions 23; 35 and 42 of waveguides 2; 3 and 4 (FIGS. 5, 7, 9), portions along which the cross-section of the guide is constant. It will be noted that, in the present application, the term "cross-section" refers to a transverse cross-section, that is a sectional part of the waveguide (according to a transverse section plane, parallel to the (y,z) plane), and not to a segment or portion of this guide.

For some parts of the waveguide, the first and second lines may not be parallel to each other, and may form some opening angle between them. This is the case, for example, for portions 24 and 45 of the guide 2 and 4, which form flared portions, in the manner of a horn-type antenna.

Moreover, these first and second lines are not necessarily continuous or rectilinear lines; in particular, they may be a succession of broken lines (see the guide 3 of FIG. 7 for example).

The waveguide 1; 1'; 2; 3; 4; 4'; 5; 6 has a rectangular cross-section in that, for each transverse cross-section of the guide, the internal zone of the guide is delimited by a rectangular outline (plate 11, plate 12, and left and right connecting elements), except if the cross-section in question falls between two successive connecting elements, and apart from alignment errors between chips. The propagation modes in this guide are of the Transverse Electrical (TE) type, more precisely $TE_{n0}$, where n is a natural number.) The propagation of these modes in the guide is comparable to the propagation that would be obtained in an equivalent guide with a rectangular cross-section delimited by four solid flat plates (see for example the paper: D. Deslandes and Ke Wu, "Accurate modeling, wave mechanisms, and design considerations of a substrate integrated waveguide," in IEEE Transactions on Microwave Theory and Techniques, vol. 54, no. 6, pp. 2516-2526, June 2006).

In the six embodiments represented, the guide 1; 1'; 2; 3; 4; 4'; 5; 6 comprises at least one rectilinear portion having a constant cross-section (portion 23 of guide 2, for example). At this portion, the guide has a width L.

This width corresponds to the extension of the internal zone of the guide, along the transverse axis y. It is the distance between two connecting elements, located on one and the other side of the guide respectively. More precisely, it is the distance between the side surface of the first connecting element 15 (or 55, or 65) and the side surface of the second connecting element 15 (or 55, or 65), as illustrated in FIG. 2 (in practice, the actual width of the guide, for the propagation of electromagnetic waves, is slightly greater than L).

The guide 1; 1'; 2; 3; 4; 4'; 5; 6 is here configured to guide waves having a frequency f between 100 GHz and 2 THz.

In the case of the guides 1; 2; 3; 4; 4'; 5 and 6, the internal space of the guide, located between the first 11; 51 and second 12; 52 plates and between the connecting elements 15; 55; 65, is occupied by a homogeneous dielectric medium having a relative permittivity $\varepsilon_r$ at the frequency f. This medium may be air, a filling polymer (in the case of guides 12; 3; 4; 4' and 6), or silicon oxide (in the case of guide 5). In order to be able to guide a wave (of the TE10 type) of frequency f, the width L mentioned above is chosen to be greater than $\lambda/2$, where $\lambda = c/(f \cdot (\varepsilon_r)^{1/2})$, c being the velocity of electromagnetic waves in vacuum. More precisely, the width L of the guide can be chosen so that its actual width $L_{eff}$ is greater than $\lambda/2$, where $L_{eff} = L + d - d^2/(0.95 \times p)$.

In the case of guide 1', the internal space of the guide, located between the first 11 and second 12 plates and between the connecting elements 15, is occupied by a composite structure formed by several different dielectric materials (see FIG. 4). In this case, the minimum width of the guide, allowing propagation of wave with a frequency f, may for example be determined by numerical simulation.

In the case of guides 1; 1'; 2; 3; 4 and 4', the micropillars 15 have a diameter d, and are arranged regularly, periodically along the edge of the guide, with a pitch p. Two successive micropillars are thus separated (at their side surfaces—stated differently, at their outer surfaces) by a distance e=p-d. The pitch p is chosen so that the linear occupancy rate d/p (i.e. the proportion of the guide border occupied by the micropillars) is greater than 50%. To achieve this, the pitch p is chosen to be less than twice the diameter d of the micropillars. This arrangement makes it possible to reduce propagation losses in the guide.

The diameter d of the micropillars is for example between 10 and 50 microns, while their height h (which is also the thickness of the zone internal to the guide) is for example between 10 and 100 microns.

In the case of the guide 6 (FIG. 14), the connecting elements 65, each of which gather a pair of microposts 651 and 652, are distributed along the guide 6 in the same way as the microposts 15 mentioned above (linear occupancy rate greater than 50% especially). The diameter of the microposts 651, 652 is the same as the diameter d mentioned above, and they each have a height of between 5 and 30 microns, for example.

In the case of the waveguide 5 (assembly by direct hybrid bonding), the total height h' of the connecting elements 55 (which is also the thickness of the zone internal to the guide) is lower than in the case of a micropillar assembly. It is, for example, between 1 and 10 microns. As for the width or diameter of the vias 55a, 55b, it is between 0.5 and 5 microns, for example (while the diameter or width of the connection elements 55c, 55d may be between 0.5 and 10 microns, for example).

It could be noted that, in the first five embodiments of the guide 1; 2; 3; 4; 5 (and for their variants 1' and 4'), the electrical connecting elements which laterally delimit the guide are electrically conductive contacting elements 15; 55, each allowing electrical conduction from the first plate 11; 51 to the second plate 11; 52 (in other words, these connecting elements each form a conductive bridge between the first plate and the second plate).

In contrast, in the sixth embodiment, the electrical connecting elements, 65, which laterally delimit the guide 6 are elements which, as already indicated, connect the first plate 11 to the second plate 12 through a capacitive connection, without direct electrical contact.

It could be noted that in the different embodiments considered here, and whatever the assembly mode considered, each connecting element 15; 55; 65 is formed by two parts (especially the microposts 151 and 152, or 651 and 652; or the assembly 55a, 55c and the assembly 55b, 55d), one bonded to the first chip and the other bonded to the second chip, and connected to each other to connect the two chips.

Waveguide According to the First Embodiment

As mentioned above, in this embodiment, the lines of micropillars 13 and 14 which border the guide, respectively on the right and left of the guide, are rectilinear, and parallel to each other (FIG. 2).

Figure 3:
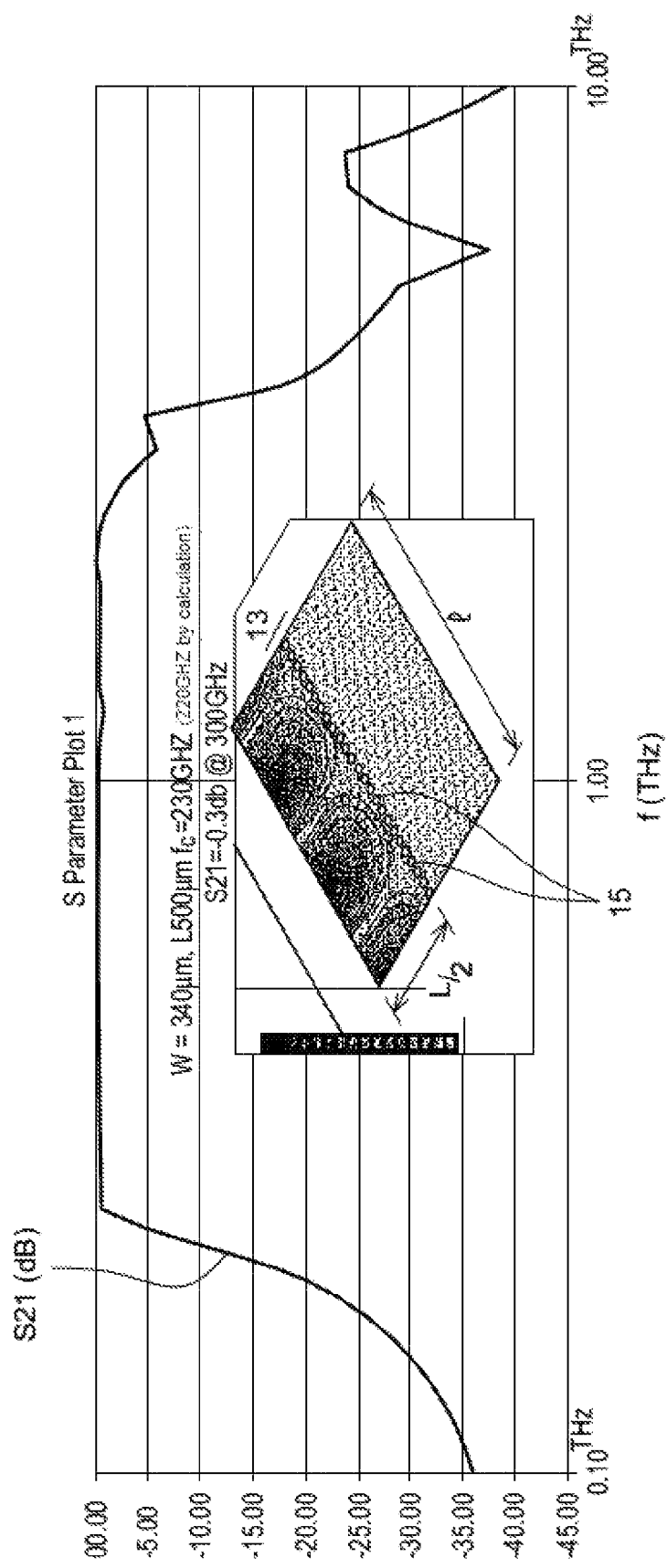
FIG. 3 shows the time change of a transmission coefficient of the waveguide of FIG. 2, as a function of the frequency of the wave guided.

FIG. 3 shows the change in a transmission coefficient S21 of the guide 1, expressed in decibels (dB), as a function of the frequency f (expressed in THz), in a case where the guide has a width L of 340 microns and a length l of 500 microns, the internal space of the guide being filled with a polymer-based material whose relative permittivity $\varepsilon_r$ is equal to about 4. For this simulation, the micropillars each have a diameter d of 10 microns, a height h of 20 microns and the pitch p between micropillars is 20 microns (50% linear occupancy). The results of FIG. 3, obtained by numerical simulation (especially taking account of the absorption in the metal elements which delimit the guide), show that the cut-off frequency fc of the guide is equal to 230 GHz, and that the transmission coefficient S21 is between 0 and −0.5 dB over a wide frequency range. At 300 GHz, for example, it is −0.3 dB, or −0.6 dB/mm. With this guide, the propagation losses are therefore much lower than with a coplanar guide or a microstrip (for which the same transmission coefficient would be more like −3 dB/mm).

In FIG. 3, a detail view of the guide 1 is inserted in the figure. It shows, in grey scale, the electric field strength associated with the wave guided, at different points of the guide, at a frequency of 464 GHz.

As already indicated, FIG. 4 shows one alternative 1' to the guide of FIG. 2. The guide 1' is identical to the guide 1 of FIG. 2, except that the internal space of the guide is occupied by a composite structure formed by several different dielectric materials, instead of being occupied by a homogeneous dielectric medium. This composite structure here comprises three layers 131, 132, 133, each made of three different dielectric materials respectively. These layers are parallel to the chips. These three layers fill the entire internal volume of the guide. As an alternative, other composite structures are contemplatable, with a different number of layers, or with etched parts, or with inclusions of another dielectric material within one of the layers.

Waveguide According to the Second Embodiment

The waveguide 2 of the second embodiment comprises a first portion 23 having a constant cross-section, which connects to a second flared portion 24, acting as a horn antenna (FIGS. 4 and 5).

At the first part 23, the right and left lines of micropillars, 13 and 14, are rectilinear and parallel to each other, and in this case, parallel to the axis x. At the second, flared part 24, which widens progressively, the right and left lines of micropillars, 25, 26, which delimit the guide 2, are rectilinear, but not parallel to each other. They form an angle between them of, for example, between 60 and 140 degrees, or even between 60 and 120 degrees.

The back end of the first part 23 of the guide, which is located opposite to the antenna, is closed. At this end, one or more micropillars 22 are distributed across the width of the guide, between the two lines 13 and 14, to close the guide section and prevent guided waves from exiting the guide at this end (reflecting them back to the antenna). Alternatively, at the back end of the guide, instead of arranging the micropillars in question to close the guide section, they could be arranged to form a resonant cavity at this back end. As a further alternative, the back end of the guide could be open (but this solution generally leads to lower performance of the guide; in such a case, the distance between the injection micropost and the open back face is, in an embodiment, chosen to be equal to a multiple of the $\lambda_g/2$, $\lambda_g$ being the wavelength guided in the guide; this distance can therefore, in particular, be equal to double that employed in the case of a back end of the guide closed by a line of microposts or vias).

The electromagnetic waves, which are guided in this guide in order to be subsequently transmitted by the antenna, are injected into the guide 2 by means of a conductive micropost 21, located on the side of the back end of the first part 23 of the guide, between the two lines 13 and 14. This micropost 21, which projects into the guide 2, is here electrically connected to the first chip of the microcircuit. This micropost 21 can also serve to extract waves received by the antenna from the guide.

The open end of the flared portion 24 of the guide (which is its widest end) is located here in proximity to a free side edge of the aforementioned chip stack, or even directly at the edge of this stack. The opening of the flared portion of the guide is located, for example, in line with a free side face of this stack (such as face 120 in FIG. 1), so that the wave radiated by the antenna can freely exit the microcircuit.

In the example of FIG. 5, the waveguide 2 includes two well-delimited parts 23 and 24 (one of which is flared), each with rectilinear edges. It should be noted, however, that one alternative would be for the left and right lines of micropillars which delimit the waveguide to be curved, and to flare progressively and continuously along the guide.

Waveguide According to the Third Embodiment

Figure 6:
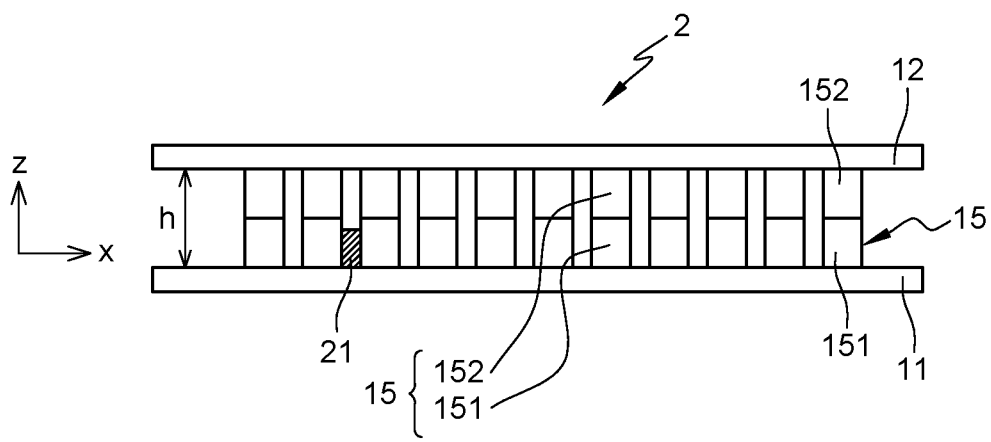
FIG. 6 schematically represents the waveguide of FIG. 5, in a side view.

The waveguide 3 of this third embodiment extends along the axis x from a first, closed end to a second, closed end (FIG. 6).

At the first end, one or more micropillars 22 are distributed across the width of the waveguide (between the two lines of micropillars that laterally delimit the guide), to close the cross-section of the guide and prevent guided waves from exiting the guide through this end.

Similarly, at the second end, one or more micropillars 32 are distributed across the width of the guide (between the two lines of micropillars that laterally delimit the guide), to close the section of the guide and prevent guided waves from exiting the guide through that second end.

The guide 3 comprises, on the side of the first end, a conductive micropost 21, electrically connected to the first chip, and which projects into the guide, between the two lines of micropillars which laterally delimit the guide. The guide 3 also comprises, on the side of the second end, a conductive micropost 31, electrically connected to the second chip, which projects into the guide, between the two lines of micropillars which laterally delimit the guide. These two microposts 21 and 31 each allow an electromagnetic wave to be injected into the guide 3 and/or extracted from the guide 3.

This arrangement especially makes it possible to transmit a very high frequency signal from the first chip to the second chip. The guide 3 here further performs a frequency filtering function. It thus makes it possible to transmit a very high frequency signal (with a frequency typically between 0.1 and 2 THz) from the first chip to the second chip, or vice versa, by filtering this signal.

This frequency filtering effect is achieved here by changes in the cross-section of the guide. In effect, the guide comprises one or more portions (here, two portions 34 and 36) that are wider than the rest of the guide.

In this case, the guide 3 comprises five portions 33, 34, 35, 36 and 37, located one after the other, in this order. The portions 33, 35 and 37 have the same width L and have a constant cross section. Portion 34 has a width L' greater than L (for example greater than twice L), and portion 35 has a width L" also greater than L. Portion 33 is located at the first end of the guide 3, while portion 37 is located at the second end. The portions 34 and 36 each form a resonant cavity, these two cavities being coupled to each other. The dimensions of these cavities (width, length) and of the junction portion 35 connecting them can be adjusted (for example by numerical simulation) in order to obtain the desired bandpass response. To make this bandpass filter more selective, the number of resonant cavities along the guide can be increased.

It will be noted that, even if the guide 3 exhibits these abrupt changes in cross-section (i.e.: with cross-sectional discontinuities corresponding to a skip in width from one portion of the guide to another), the guide 3 remains bordered by micropillars on each side of the guide, in a continuous manner, without exhibiting wide openings on the sides of the guide (i.e. without exhibiting openings wider than the diameter d of the micropillars).

It could be noted that the micropost 21 is connected here to the first chip (but not to the second) while the micropost 31 is connected to the second chip (but not to the first one). However, in one alternative, these two microposts could both be connected to the same chip (for example the first chip), without changing chip for the signal filtered by the guide.

Waveguide According to the Fourth Embodiment

As in the second embodiment, the waveguide 4 of the fourth embodiment comprises a flared portion, 45, acting as a horn antenna. It also includes a rectilinear portion, 42, which leads to this flared portion 45. A frequency filtering function is implemented at the portion 42 (in this case, this function is implemented slightly differently from the third embodiment). The electromagnetic wave guided by the guide 4 is injected thereinto at an end of the guide opposite to the antenna. It is injected by means of a progressively widening track 44 that eventually forms the first plate 11 of the waveguide (instead of being injected by virtue of a micropost projecting into the guide).

As can be seen in FIGS. 9 and 10, a microstrip-like electrical track 410, located on the first chip side, connects to track 44, this track 44 then gradually widens until it is close to the width L of the guide. The track 44 then connects to the entrance of the guide 4, at the end of the guide opposite to the antenna. Specifically, track 44 connects to the first plate 11 of the guide (lower plate of the guide). Here, the track 410, track 44 and the first plate 11 are in one piece (etched in a same metal plane).

At the portion 42 of the guide, the lines of micropillars 13 and 14 which border the guide, respectively on the right and left side, are rectilinear and parallel to each other (the cross-section of the guide is thus constant, unlike the guide of the third embodiment). The filtering function mentioned above is then achieved by virtue of additional micropillars 15', distributed inside the guide so as to form one or more barriers extending transversely through the guide to create one or more constrictions.

The guide 4 thus comprises a short line of additional micropillars, 43, which extends inwardly of the guide from the line of micropillars 13 which delimits the right edge of the guide. It also comprises a further line of additional micropillars, 43', which extends, inwardly of the guide, from the line of micropillars 14. The two lines 43 and 43' are located facing each other, and define a constriction in the middle of the guide cross-section.

The guide 4 comprises another pair of micropillar lines, 44 and 44', which extend transversely to the guide therewithin. These two lines 44 and 44' delimit a constriction which is less narrow than for lines 43 and 43', and which is located upstream of lines 43 and 43'. The guide 4 comprises yet another pair of micropillar lines, 46 and 46', which extend transversely to the guide, therewithin, and which are located downstream of lines 43 and 43'. The two transverse lines 46 and 46' are symmetrical to the lines 44 and 44' with respect to the lines 43 and 43'. The guide 4 may comprise further pairs of transverse lines located upstream and/or downstream of the lines 43, 43', with a progressive narrowing along the guide (from one pair of lines to the other), and then a progressive widening of the constrictions in question. This type of arrangement allows different filtering functions: low-pass, high-pass, band-pass or band-stop. It will be noted, however, that pure low-pass filtering, since such a guide only allows transmission of a wave of frequency below the low cut-off frequency of the waveguide itself.

As for the flared portion 45, it is identical, or at least similar, to the flared portion 24 of the guide 2 of the second embodiment.

Figure 12:
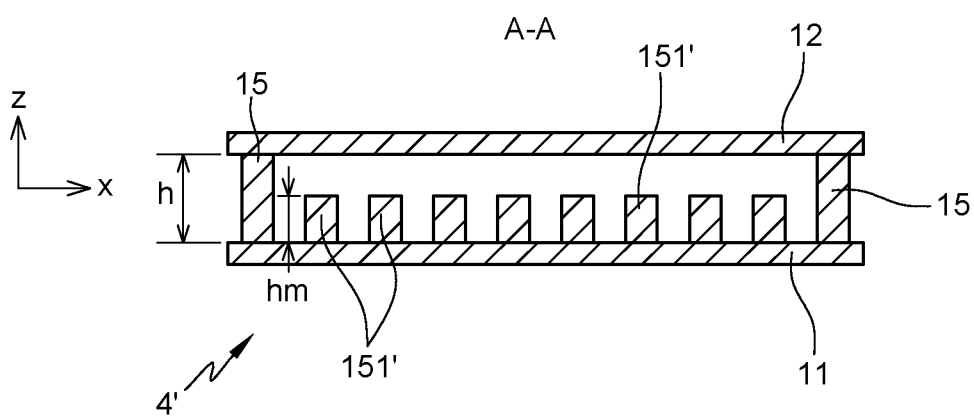
FIG. 12 schematically represents the waveguide of FIG. 11, in a top cross-section view.

As already indicated, FIGS. 11 and 12 show one alternative 4' to the guide 4 of FIG. 9. The guide 4' is identical to the guide 4 of FIG. 9, except that the additional micropillar lines 15' (which locally form cross-sectional constrictions) are replaced with micropillar lines 151' internal to the guide. In the scope of this alternative, to locally reduce the cross-section of the guide:
  instead of employing micropillars 15' which each extend over the entire height h of the guide, but which are distributed over only part of the width L of the guide (to leave passage for the waves),
  microposts 151' are employed, each extending over only part of the height h of the guide, but that are nevertheless distributed over the entire width L of the guide.

The guide 4' thus comprises several lines 43", 44", 46" of microposts 151', each of which extends transversely to the guide 4', inside the guide. Each micropost 151' extends from the first or second plate 11, 12 (here from the first one), towards the other plate. Each micropost 151' has a height $h_m$ less than the (inner) height h of the guide, for example less than two thirds or even half of this height h.

In other alternatives, microposts could be employed that each extend over only part of the height of the guide, and that are distributed over only part of the width of the guide.

Waveguide According to the Fifth Embodiment

As indicated above, the waveguide 5 of the fifth embodiment is made between two chips assembled to each other by "direct hybrid bonding", instead of being assembled by means of micropillars. The height h' of the guide is therefore smaller than in the previous four embodiments.

In this fifth embodiment, the contacting elements 55 may be arranged along the guide 5 in the same or at least comparable manner as the micropillars of first to fourth embodiments. In particular, they may be distributed in such a way as to form a horn antenna, or in such a way as to achieve constrictions or changes in cross-section in order to perform frequency filtering of the guided waves.

Waveguide According to the Sixth Embodiment

The waveguide 6 according to the sixth embodiment is identical, or at least similar, to the waveguide 1 of the first embodiment, except that, for each pair of microposts facing each other, the two microposts in question, 651 and 652, are not in electrical contact with each other (instead of being connected to each other to form a conductive micropillar). Their respective end faces 653 and 654 are separated from each other by an electrical insulator. They are separated from each other by a small but non-zero distance $e_z$.

The connecting elements 65, which delimit the guide 6 laterally, on either side thereof, are thus each formed by two microposts 651, 652 spaced apart from each other. For each pair, the first micropost 651 extends from the first plate 11 to its end face 653. This first micropost 651 extends perpendicular to the first plate and is in electrical contact therewith. The second micropost 652 extends from the second plate 12 to its end face 654. It extends perpendicular to the second plate, and is in electrical contact therewith. The first and second microposts are facing each other, but not necessarily perfectly. As can be seen in FIG. 14, a slight misalignment (for example less than one third of the diameter d of the microposts) between the microposts 651 and the microposts 652 may be present (this misalignment being due to, for example, an alignment error during chip assembly).

For each connecting element 65, the gap $e_z$ between the two end faces 653 and 654 of the two microposts is, for example, less than 2 microns, or even less than 1 micron or even 0.5 micron. This allows for a capacitive connection for which the junction capacitance is quite high.

In this sixth embodiment, the connecting elements 65 may be arranged along the guide 6 in the same or at least comparable manner as the micropillars of first to fourth embodiments. In particular, they may be distributed in such a way as to form a horn antenna, or in such a way as to achieve constrictions or changes in cross-section in order to perform frequency filtering of the guided waves.

Furthermore, the connecting elements themselves may be made differently. For example, each connecting element could comprise a single micropost (instead of two), in contact with the first plate, and extending almost to the second plate, its end face being separated from the second plate by the distance $e_z$ in question. As a further alternative, the guide could be delimited, along each edge, by a line of microposts, with an alternation between:
  a micropost connected to the first plate, and extending almost to the second plate, but without electrical contact with it (with a gap $e_z$), then
  a micropost connected to the second plate, and extending almost to the first plate, but without contact therewith (with a gap $e_z$),
  and so on.

Various alternatives can be made to the waveguide that has just been set forth, in addition to those already mentioned. For example, in a plane parallel to the chips, the guide could have a general Y shape in order to mix two very high frequency signals (each injected at one of the branches of the Y), or on the contrary to make a signal splitter (separator). It could also have a general X shape, with two inlets (one per branch) and two outlets (again, one per branch). The guide could also extend along a curved mean line, making a bend.

Furthermore, the connecting elements could be microbeads, each microbead being in contact, on the one hand, with the first plate and, on the other hand, with the second plate. Such microbeads may, for example, have a diameter of between 20 microns and 200 microns, and be arranged with a pitch p equal to twice their diameter. Specific microbeads of small diameter (for example between 1 and 5 microns in diameter), for example Indium-based, may also be employed to laterally delimit the guide.

The invention claimed is:

1. A microcircuit integrating a waveguide with a rectangular cross-section, comprising a first chip and a second chip assembled on each other; the waveguide being located in a junction zone between chips and extending in parallel to the chips, the waveguide comprising a first conductive plate, located on a side of the first chip and parallel to the first chip, and a second conductive plate, located on a side of the second chip and parallel to the second chip, the waveguide being laterally delimited, on one side of said waveguide and on another side of said waveguide that is opposite to said one side, by one or more electrical connecting elements electrically connecting the first chip to the second chip.

2. The microcircuit according to claim 1, wherein the one or more electrical connecting elements comprise microposts, or micropillars, or microbeads arranged in a line one after the other, along said one side of the waveguide.

3. The microcircuit according to claim 2, wherein said microposts, or micropillars or microbeads are distributed along said one side of the waveguide with a linear occupancy rate higher than 50%.

4. The microcircuit according to claim 2, wherein
the first plate is covered with a first electrically insulating layer through which first conductive vias pass,
the second plate is covered with a second electrically insulating layer through which second conductive vias pass,
the second layer is in contact with the first layer and adheres to the first layer, the second vias being in contact with the first vias, either directly or through connection elements, and wherein
each electrical connecting element comprises one of the first vias, together with the corresponding second via with which it is in contact.

5. The microcircuit according to claim 1, wherein at least some of said one or more electrical connecting elements are electrically conductive contacting elements, each allowing for electrical conduction from the first plate to the second plate.

6. The microcircuit according to claim 1, wherein at least one of said one or more electrical connecting elements comprises an electrically conductive micropost which extends from the first plate towards the second plate, and which is spaced from the second plate to connect the first plate to the second plate through capacitive connection.

7. The microcircuit according to claim 6, wherein said at least one of said one or more electrical connecting elements, which connects the first plate to the second plate through capacitive connection, comprises an additional electrically conductive micropost which extends from the second plate towards the first plate to an end face of the additional micropost, the end face of the additional micropost being facing and at a reduced distance from an end face of said micropost.

8. The microcircuit according to claim 1, wherein the waveguide is dimensioned to guide an electromagnetic wave having a frequency f greater than or equal to 100 GHz.

9. The microcircuit according to claim 8, wherein the internal space of the waveguide, located between the first and second plates and between said one or more electrical connecting elements, is occupied by a dielectric medium having a relative permittivity $\varepsilon_r$ at frequency f, and wherein the waveguide has a cross-section whose width, in a direction parallel to the chips, is greater than $\lambda/2$, where $\lambda=c/(f \cdot (\varepsilon_r)^{1/2})$, c being the velocity of electromagnetic waves in vacuum.

10. The microcircuit according to claim 1, wherein the internal space of the waveguide, located between the first and second plates and between said one or more electrical connecting elements, is occupied by a composite structure formed by several different dielectric materials.

11. The microcircuit according to claim 1, wherein at least one of the first and second chips integrates one or more components of the transistor, diode or amplifier type, configured to generate, amplify or filter an electric signal having a frequency greater than or equal to 100 GHz.

12. The microcircuit according to claim 1, wherein one end of the waveguide is open and wherein at least a part of the waveguide, which opens out through said opening, is flared and widens towards said opening.

13. The microcircuit according to claim 1, wherein the waveguide has one or more abrupt changes in cross-section.

14. The microcircuit according to claim 1, wherein the waveguide comprises one or more lines of additional connecting elements, each of which extends transversely to the waveguide, within the waveguide, to form one or more constrictions in the waveguide.

15. The microcircuit according to claim 1, wherein the waveguide comprises one or more inner microposts, each located within the waveguide, each inner micropost extending from the first plate towards the second plate, and having a height less than a gap between the first plate and the second plate, for example less than two thirds of said gap.

* * * * *